United States Patent
Gao et al.

(10) Patent No.: US 8,760,201 B1
(45) Date of Patent: Jun. 24, 2014

(54) DIGITALLY PROGRAMMED CAPACITANCE MULTIPLICATION WITH ONE CHARGE PUMP

(71) Applicant: Analog Devices Technology, Hamilton (BM)

(72) Inventors: Ting Gao, Shanghai (CN); Jiefeng Yan, Shanghai (CN)

(73) Assignee: Analog Devices Technology, Hamilton (BM)

( * ) Notice: Subject to any disclaimer, the term of this patent is extended or adjusted under 35 U.S.C. 154(b) by 0 days.

(21) Appl. No.: 13/793,438

(22) Filed: Mar. 11, 2013

(51) Int. Cl.
*H03L 7/06* (2006.01)
(52) U.S. Cl.
USPC .......................................... 327/157; 327/150
(58) Field of Classification Search
None
See application file for complete search history.

(56) References Cited

U.S. PATENT DOCUMENTS

| | | | |
|---|---|---|---|
| 7,598,793 B1 | 10/2009 | Sengupta et al. | |
| 7,902,928 B2 | 3/2011 | Wang | |
| 7,936,222 B2 | 5/2011 | Wang | |
| 8,259,890 B2 | 9/2012 | Chen et al. | |
| 2003/0034846 A1* | 2/2003 | Fan | 331/17 |
| 2003/0117195 A1* | 6/2003 | Chang | 327/159 |
| 2005/0030001 A1 | 2/2005 | Jasa et al. | |
| 2009/0015338 A1* | 1/2009 | Frey | 331/16 |
| 2012/0200327 A1 | 8/2012 | Sreekiran et al. | |

OTHER PUBLICATIONS

Jan Craninckx and Michael S.J. Steyaert, "A Fully Integrated CMOS DCS-1800 Frequency Synthesizer", IEEE Journal of Solid-State Circuits, vol. 33, No. 12, Dec. 1998, pp. 2054-2065.

* cited by examiner

*Primary Examiner* — Cassandra Cox
(74) *Attorney, Agent, or Firm* — Knobbe, Martens, Olson & Bear, LLP

(57) ABSTRACT

Systems and methods for capacitance multiplication using one charge pump for a phase lock loop employ a digital controlled loop filter that operates in a time division mode. Embodiments of the loop filter block the current from the charge pump according to the digital control, such that the charge pump cannot charge or discharge the integral capacitor when the digital control is enabled. Because at least a portion of the current is blocked, it takes more time for the charge pump to charge or discharge the capacitor to a certain level. The capacitor then appears to be larger than its actual value with respect to operation of the phase lock loop.

20 Claims, 4 Drawing Sheets

DIGITALLY PROGRAMMED CAPACITANCE MULTIPLICATION WITH ONE CHARGE PUMP

FIELD OF THE INVENTION

The disclosure relates to multiplying capacitance using a digitally configured loop filter for charge pump phase lock loop (PLL) circuits.

BACKGROUND

A phase-locked loop or phase lock loop (PLL) is a negative feedback control system where an oscillator-generated signal is phase and frequency locked to an input reference signal. Embodiments comprise an electronic circuit including a phase detector, a charge pump, a filter including an integral capacitor C1 and a resistor R1, and a variable frequency oscillator. The phase detector compares the phase of the input reference signal with the phase of the signal derived from the output of the oscillator and generates an error signal. The charge pump converts the error signal to an error current and the integral capacitor C1 and the resistor R1 act upon the error current to generate an oscillator control voltage. The integral capacitor C1 integrates the error current (integral path) to set an average oscillator frequency and the resistor R1 provides instantaneous phase correction (proportional path). The oscillator control voltage adjusts the frequency of the oscillator to keep the phases matched.

Stability is one of the important issues in designing a phase lock loop. The damping factor, a measure of the overshoot and ringing in the output of the PLL, is shown in equation 1 and the open loop bandwidth, the frequency at which the loop gain equals one, is shown in equation 2.

$$\zeta = \frac{R_1}{2}\sqrt{\frac{K_{cp}K_{vco}C_1}{N}} \qquad \text{Equation 1}$$

$$f_u = \frac{K_{cp}K_{vco}R_1}{2\pi N} \qquad \text{Equation 2}$$

While several factors can be increased to improve the damping factor, increasing the capacitance C1 of the integral capacitor increases the stability without affecting the bandwidth. In many low bandwidth phase lock loop embodiments, a large capacitor, up to several nanofarads (nF) for example, can be used to achieve an acceptable damping factor. However, it is very difficult to integrate a large capacitor on an integrated circuit (IC). Capacitance multiplication is used to achieve an acceptable damping factor with a smaller capacitor.

Embodiments of PLLs with capacitance multiplying use a dual path loop filter comprising an integral charge pump and a proportional charge pump. The integral charge pump generates an amount of charge based on the integration of the error signal from the phase detector to the integral capacitor C1, and similarly, the proportional charge pump generates a proportional amount of charge based on the error signal from the phase detector to the resistor R1. The outputs of the integral and proportional charge pumps are added and the resulting voltage is applied to a voltage controlled oscillator (VCO). The current of the proportional charge pump is usually several times that of the integrator charge pump. When the current of the proportional charge pump is N times that of the integral charge pump, it takes N times the time for the integral capacitor C1 to accumulate a certain amount charge, making it appear that the capacitance of the integral capacitor C1 is multiplied by a factor of N.

However, such embodiments use two charge pumps to employ capacitance multiplication. The second charge pump uses additional IC area, and results in increased power consumption and increased costs. Further, due to mismatches between the two charge pumps, the capacitance multiplication factor, and thus, the PLL damping factor cannot be precisely controlled. Further yet, the second charge pump will contribute additional noise to the PLL circuit.

SUMMARY

The present disclosure provides systems and methods for charge pump PLL capacitance multiplication using one charge pump and a digital configured loop filter in some embodiments. A blocking circuit is configured to allow a 1/N portion of the phase error pulses to charge or discharge the integral capacitor C1, where N is an integer. Because the blocking circuit is blocking a (N−1)/N portion of the phase error pulses, it takes the charge pump N times the time or N times longer when N is greater than 1 to charge or discharge the integral capacitor C1 to a certain amount of charge. Thus, the integral capacitor C1 having a capacitance C appears to have a capacitance of N×C.

In certain embodiments, a charge pump phase lock loop is provided that comprises a phase detector configured to generate a phase error signal based at least in part on a comparison of a phase of a reference clock signal and a phase of a feedback signal, a charge pump configured to convert the phase error signal to a charge current signal, a digital controlled loop filter configured to receive the charge current signal and the phase error signal and to charge or discharge an integral capacitor with a 1/N portion of the charge current signal to generate a control voltage where N is an integer greater than 1. The capacitance of the integral capacitor appearing to be approximately N times the actual capacitance of the integral capacitor. The charge pump phase lock loop further comprises a voltage controlled oscillator configured to receive the control voltage and adjust a clock signal based on the control voltage where the feedback signal is based at least in part on the clock signal from the voltage controlled oscillator.

In some embodiments, a method of capacitance multiplication for a charge pump phase lock loop circuit is provided. The method comprises detecting a phase difference between a reference clock and a signal derived from an output clock signal of a voltage controlled oscillator, converting a phase error signal based at least in part on the phase difference to a charge current signal, and one of charging and discharging an integrating capacitor with a 1/N portion of the charge current signal to generate a control voltage where N is an integer greater than 1. The integrating capacitor has a capacitance C and the phase lock loop operates as if the capacitance of the integrating capacitor is approximately N times C. The method further comprising applying the control voltage to the voltage controlled oscillator to control the output clock signal.

According to other embodiments, a digital controlled loop filter providing capacitance multiplication for a charge pump phase lock loop comprises a blocking circuit configured to generate a blocking signal based at least in part on a blocking factor comprising an integer greater than 1 and the occurrences of a phase error signal. The phase error signal is based at least in part on a phase difference between a reference clock and a signal derived from a clock output of a voltage controlled oscillator. The digital controlled loop filter further comprises a loop filter configured to block a portion of a current based at least in part on the phase error signal from charging or discharging an integrating capacitor. The portion is based at least in part on the blocking factor. The charge pump phase lock loop operates such that the capacitance of the integrating capacitor comprises approximately the blocking factor times the actual capacitance of the integrating capacitor.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention. Throughout the drawings, reference numbers are re-used to indicate correspondence between referenced elements.

DETAILED DESCRIPTION OF EMBODIMENTS

The present disclosure provides systems and methods for capacitance multiplication using one charge pump and a digital controlled loop filter for a phase lock loop (PLL). Embodiments employ a digital controlled loop filter that operates in a time division mode. Embodiments of the loop filter block the current from the charge pump according to the digital control, such that the charge pump cannot charge or discharge the integral capacitor when the digital control is enabled. Thus, it will take more time for the charge pump to charge or discharge the capacitor to a certain level. The capacitor then appears to be larger than its actual value.

Figure 1:
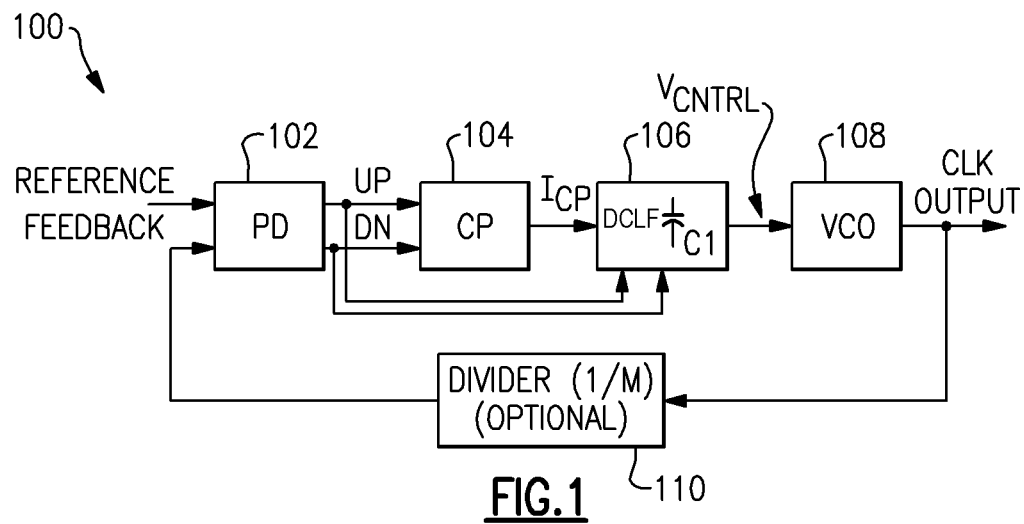
FIG. 1 illustrates a block diagram of an exemplary charge pump PLL with charge multiplication using one charge pump and a digital controlled loop filter, according to certain embodiments.

For a more detailed understanding of the invention, reference is first made to FIG. 1. FIG. 1 illustrates a block diagram of an exemplary charge pump phase lock loop circuit (PLL) 100 with charge multiplication using one charge pump. The PLL 100 comprises a phase detector (PD) 102, a charge pump (CP) 104, a digital controlled loop filter (DCLF) 106 including an integral capacitor C1, and a voltage controlled oscillator (VCO) 108.

The PLL 100 further comprises an optional divider 110 having a division ratio M, which can be included in the PLL 100 when frequency multiplication of the clock output is desired, as is known to one of skill in the art from the disclosure herein.

The phase detector 102 receives a REFERENCE clock signal and a FEEDBACK signal derived from the output of the VCO 108 and compares the phase of the REFERENCE signal and the phase of the FEEDBACK signal. Based on the comparison, the phase detector 102 generates a phase error information signal, either an UP signal or a DOWN signal, where the phase error information signal indicates the magnitude of the phase difference between the REFERENCE clock signal and the clock output of the voltage controlled oscillator 108. Further, the enabled signal, either UP or DOWN, indicates whether the VCO CLOCK OUTPUT signal is too fast or too slow when compared with the REFERENCE signal. For example, the DOWN signal indicates that the VCO CLOCK OUTPUT signal is too fast when compared with the REFERENCE signal and the UP signal indicates that the VCO CLOCK OUTPUT signal is too slow when compared with the REFERENCE signal. If the phase difference between the REFERENCE clock signal and the FEEDBACK signal is less than a predetermined amount, such that the phase difference can be considered to be approximately zero, the phase detector 102 does not generate the UP signal or the DOWN signal.

In an embodiment, the phase error information signals UP and DOWN are digital pulses whose widths are proportional to the phase error. In a further embodiment, the phase detector 102 comprises a phase/frequency detector 102 for better loop performance. Numerous embodiments of phase detector circuits 102 or phase frequency detector circuits 102 which compare the REFERENCE signal and the FEEDBACK signal to generate phase error signals are known to those of skill in the art from the disclosure herein.

The charge pump 104 receives the phase error information signals UP and DOWN from the phase detector 102. The phase error information signals UP and DOWN control the charge pump 104 to charge or discharge the digital controlled loop filter 106 with constant current. For example, the DOWN signal causes the charge pump 104 to discharge the digital controlled loop filter 106 and the UP signal causes the charge pump 104 to charge the digital controlled loop filter 106. The charge pump 104 converts the phase information signals UP and DOWN to an analog error current or charge signal $I_{CP}$.

In an embodiment, the charge is proportional to the pulse widths of the phase error information signals UP and DOWN. Numerous embodiments of charge pump circuits 104 which generate current signals based at least in part on the phase error signals from the phase detector 102 are known to those of skill in the art from the disclosure herein.

The digital controlled loop filter 106 comprises the integral capacitor C1 and receives the error current $I_{CP}$ from the charge pump 104 and the phase information signals UP and DOWN from the phase detector 102. The error current $I_{CP}$ charges or discharges the integral capacitor C1 to generate a control voltage $V_{CNTRL}$. The digital controlled loop filter 106 is configured to prevent the charge current $I_{CP}$ from charging or discharging the integral capacitor C1 during a portion of the UP and DOWN signals. The portion of the UP and DOWN signals is digitally controlled in the time domain.

The VCO 108 receives the control voltage $V_{CNTRL}$ to control the CLOCK OUTPUT signal. If the UP signal from the phase detector 102 and the digital control signal of the digital controlled loop filter 106 are enabled, the charge pump 104 charges the digital controlled loop filter 106 and the control voltage $V_{CNTRL}$ into the voltage controlled oscillator 108 increases, which increases the output frequency of the CLOCK OUTPUT signal from the VCO 108. If the DOWN signal and the digital control signal of the digital controlled loop filter 106 are enabled, the charge pump 104 discharges the digital controlled loop filter 106 and the control voltage $V_{CNTRL}$ into the voltage controlled oscillator 108 decreases, which decreases the output frequency of the CLOCK OUTPUT signal from the VCO 108. If neither the UP signal nor the DOWN signal is enabled, the output frequency of the CLOCK OUTPUT signal of the VCO 108 is not adjusted. If the digital control signal of the digital controlled loop filter 106 is not enabled, the output frequency of the CLOCK OUTPUT signal of the VCO 108 is not adjusted.

The CLOCK OUTPUT signal of the VCO 108 is input via the optional divisor 110 to the phase detector 102 as the FEEDBACK signal. Numerous embodiments of VCO circuits 108 that control an output clock based on an input control voltage are known to those of skill in the art from the disclosure herein.

Figure 2:
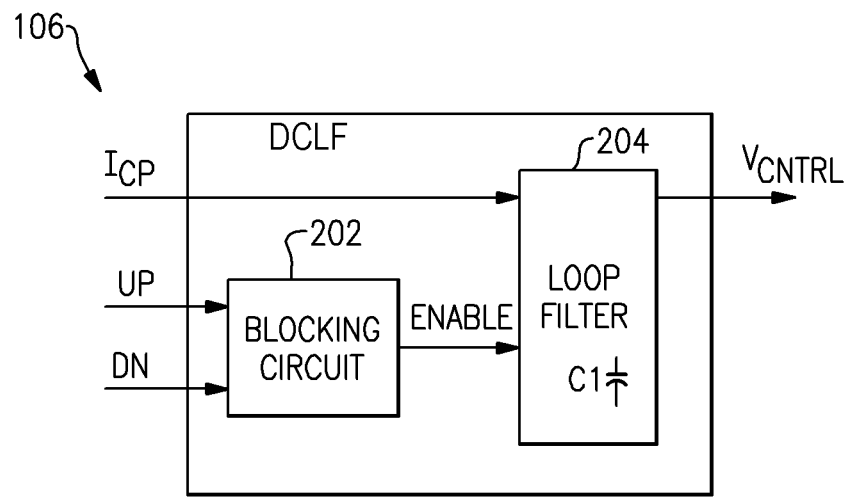
FIG. 2 illustrates a block diagram of an exemplary digital controlled loop filter for use in the charge pump PLL of FIG. 1, according to certain embodiments.
Figure 2A:
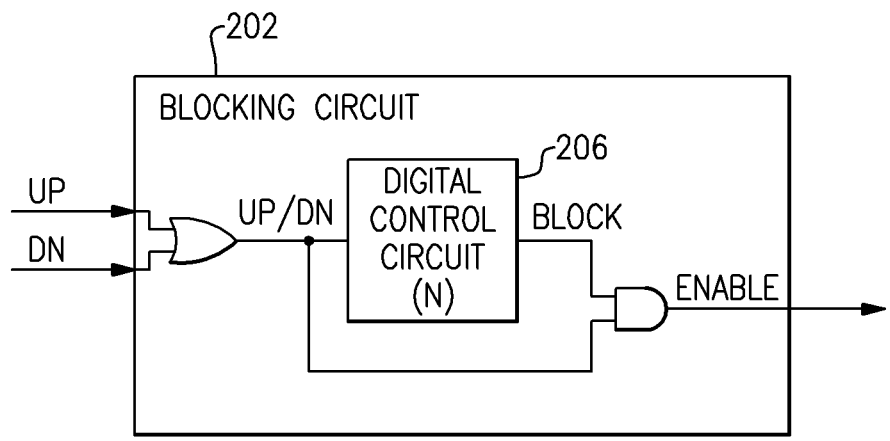
FIG. 2A illustrates a block diagram of an exemplary blocking circuit for use in the digital controlled loop filter of FIG. 2, according to certain embodiments.

FIG. 2 illustrates a block diagram of an exemplary digital controlled loop filter 106 comprising a blocking circuit 202 and a loop filter 204 including the integral capacitor C1. FIG. 2A illustrates a block diagram of an exemplary blocking circuit 202. The blocking circuit 202 receives the UP and DOWN signals from the phase detector 102 and generates a first digital control signal BLOCK based at least in part on the UP and DOWN signals and a blocking factor 1/N where N is an integer. Based at least in part on the received UP and DOWN signals and the digital control signal BLOCK, the blocking circuit generates a second digital control signal ENABLE.

The loop filter 204 receives the charge signal $I_{CP}$ from the charge pump 104 and the ENABLE signal from the blocking circuit 202. In an embodiment, the function of the blocking circuit is to periodically block some or a portion of the UP and DOWN signals, which prevents the charge pump 102 from charging or discharging the integral capacitor C1 of the loop filter 204.

Referring to FIG. 2A, one embodiment of the blocking circuit 202 comprises a digital control circuit 206 and receives the UP and DOWN signals from the phase detector 102. In an embodiment, the UP and DOWN signals are logically OR'd together to generate a signal UP/DN which indicates the occurrence of either an UP signal or a DOWN signal. In other embodiments, other circuits can be used to generating a digital signal indicating the occurrence of either an UP signal or a DOWN signal from the phase detector 102.

The digital control circuit 206 receives the UP/DN signal and generates the blocking signal BLOCK based at least in part on an integer value N, where the BLOCK signal permits the charge current $I_{CP}$ to charge or discharge the integral capacitor C1 for a 1/N portion of the UP/DN signal and prevents the charge current $I_{CP}$ from charging or discharging the integral capacitor C1 for a (N−1)/N portion of the UP/DN signal. N can be any integer number including one.

In one embodiment, the digital control circuit 206 comprises a digital counter configured to count to N such that an output of the digital control circuit 206 comprises an output pulse at every Nth input pulse. In an embodiment, the output of the digital counter 206 comprises the BLOCK signal. In a further embodiment, the BLOCK signal is logically AND'd with the UP/DN signal to generate the ENABLE signal. In other embodiments, other circuits can be used to generate a digitally controlled ENABLE signal.

Figure 3:
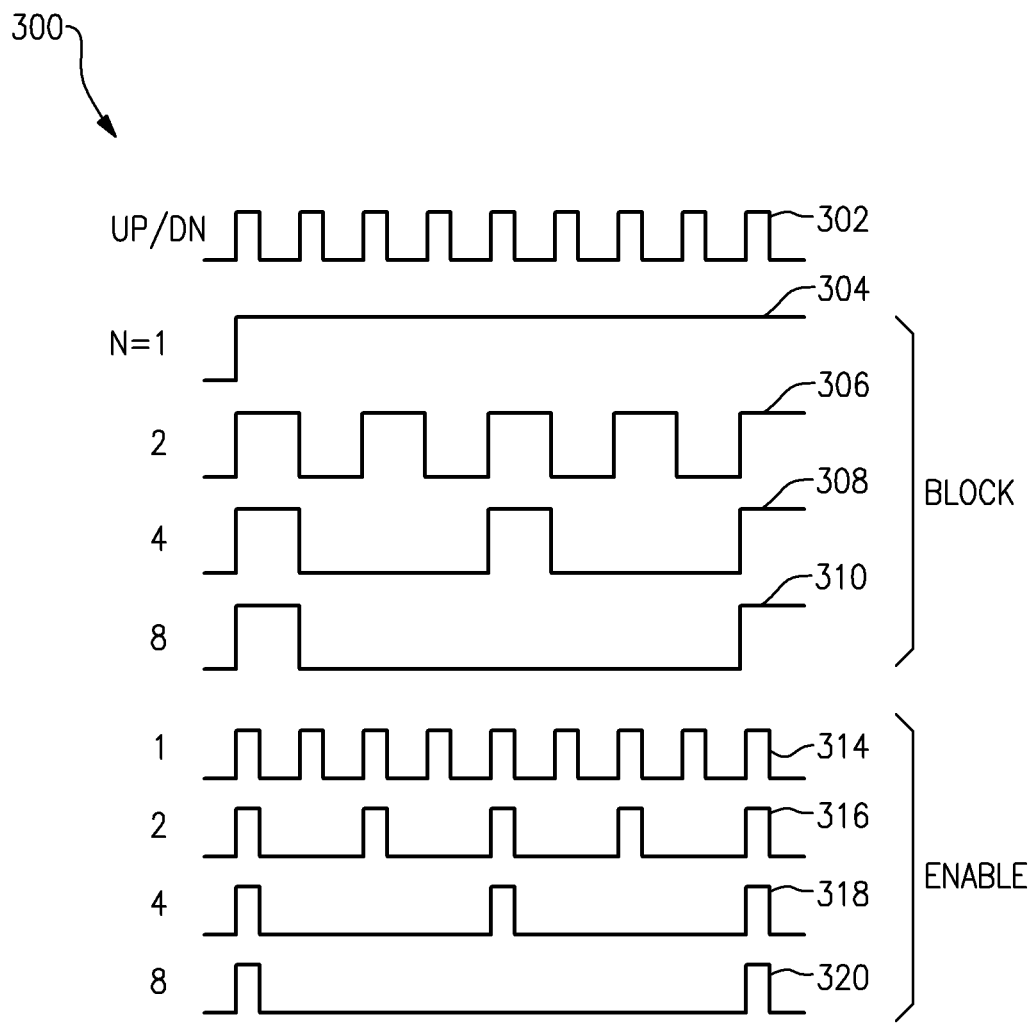
FIG. 3 is a timing diagram illustrating the function of an exemplary blocking circuit for use in the digital controlled loop filter of FIG. 2, according to certain embodiments.

FIG. 3 is a timing diagram 300 illustrating exemplary functions of the blocking circuit 202 used in the digital controlled loop filter 106 to generate the digitally controlled ENABLE signal. The timing diagram 300 comprises the UP/DN signal 302 representing the occurrence of the UP or the DOWN signal from the phase detector 102. The timing diagram 300 further comprises a set of BLOCK signals 304, 306, 308, 310, and a corresponding set of ENABLE signals 314, 316, 318, 320. The BLOCK signals 304, 306, 308, 310 pass a 1/N fraction of the UP/DN signal to form the ENABLE signals 314, 316, 318, 320 where N=1, 2, 4, 8, respectively, in the illustrated embodiments. Stated another way, the BLOCK signals 304, 306, 308, 310 block a (N−1)/N fraction of every N occurrences of the UP/DN signal 302 to form the ENABLE signals 314, 316, 318, 320 where N=1, 2, 4, 8, respectively, in the illustrated embodiments.

For example, when N=1, BLOCK signal 304 is always high and passes the entire UP/DN signal 302 to form the ENABLE signal 314. As illustrated, the ENABLE signal 314 is approximately the same as the UP/DN signal 302 and no occurrences of UP or DOWN are blocked. The integrating capacitor C1 charges or discharges at approximately the same rate it would without the blocking circuit 202. No current multiplying occurs.

Signals BLOCK 306 and ENABLE 316 illustrate the function of the blocking circuit 202 when N=2. As illustrated, BLOCK 306 passes ½ and blocks ½ of the occurrences of the UP/DN signal 302, resulting in ENABLE 316. ENABLE 316 permits the charge pump 104 to charge or discharge the integrating capacitor C1 at approximately half of the occurrences of the UP/DN signal 302. In other words, an approximate ½ portion of the UP/DN signal is blocked. This has the affect of multiplying the capacitance of the integrating capacitor C1 by 2. In some embodiments, this has the affect of multiplying the capacitance of the integrating capacitor C1 by approximately 2. In other embodiments, this has the affect of multiplying the capacitance of the integrating capacitor by precisely 2.

In another example, when N=4, BLOCK 308 passes the fourth occurrence and blocks three of every four occurrences of the UP/DN signal 302, resulting in ENABLE 318. ENABLE 318 permits the charge pump 104 to charge or discharge the integral capacitor C1 at approximately a quarter of the occurrences or rate of the UP/DN signal 302. An approximate ¾ portion of the UP/DN signal is blocked from the loop filter 204. This has the affect of multiplying the capacitance of the integrating capacitor C1 by 4. In some embodiments, this has the affect of multiplying the capacitance of the integrating capacitor C1 by approximately 4. In other embodiments, this has the affect of multiplying the capacitance of the integrating capacitor by precisely 4.

Similarly, when N=8, BLOCK 310 passes the eighth occurrence and blocks seven of every eight occurrences of the UP/DN signal 302, resulting in ENABLE 320. ENABLE 320 permits the charge pump 104 to charge or discharge the integrating capacitor at approximately an eighth of the rate of the UP/DN signal 302. An approximate ⅞ portion of the UP/DN signal is blocked from the loop filter 204. This has the affect of multiplying the capacitance of the integrating capacitor C1 by 8. In some embodiments, this has the affect of multiplying the capacitance of the integrating capacitor C1 by approximately 8. In other embodiments, this has the affect of multiplying the capacitance of the integrating capacitor by precisely 8.

FIG. 3 illustrates the functionality of the blocking circuit 202 where N=1, 2, 4, 8. In other embodiments, other integers N can be used. In further embodiments, N is an integer greater than 1 for capacitance multiplication in the PLL 100. The BLOCK signal passes 1/N and blocks (N−1)/N of every N occurrences of the UP/DN signal 302. FIG. 2A illustrates one embodiment of the blocking circuit 202. Other embodiments are possible to achieve the functions of the blocking circuit 202 illustrated in FIG. 3 and also for other values of N from the disclosure herein.

In an embodiment, N is user selectable. In other embodiments, N is programmably selectable prior to fabrication of an on chip loop filter 106. In yet other embodiments, N is programmably selectable during operation of the digital controlled loop filter 106.

Figure 4:
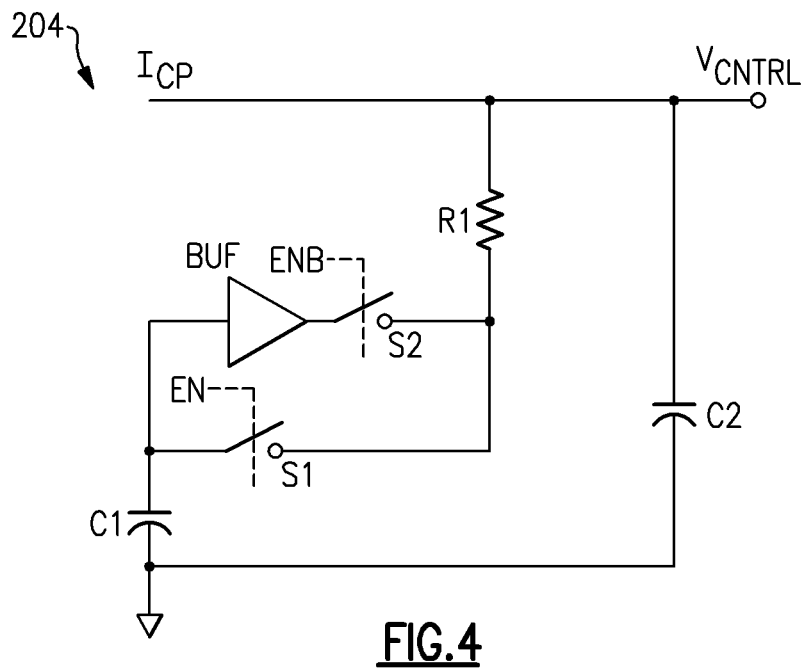
FIG. 4 illustrates a block diagram of an exemplary loop filter for use in the digital controlled loop filter of FIG. 2, according to certain embodiments.

FIG. 4 illustrates a block diagram of an embodiment of the loop filter 204. In an embodiment, the loop filter 204 comprises a resistor R1, the integral capacitor C1 having a capacitance C, a unity gain buffer BUF, a first switch S1 controlled by the ENABLE signal, and a second switch S2 controlled by the inverse of the ENABLE signal or the ENABLE BAR signal. In an embodiment, the unity gain buffer comprises an operational amplifier with a differential input and a single-ended output that is configured as a unity gain buffer. The unity gain buffer BUF, in certain embodiments, has an input/output voltage swing that is wider or greater than a voltage swing of a control voltage of the PLL 100. Further, in certain embodiments, the gain bandwidth product of the operational amplifier is approximately 10 times larger than the reference frequency REFERENCE of the PLL 100.

For embodiments where the PLL 100 comprises a type II third order phase locked loop, the loop filter 204 further comprises a second capacitor C2. In certain embodiments, the capacitor C2 is used to smooth large ripple on the VCO voltage control signal $V_{CNRTL}$.

As illustrated in FIG. 4, resistor R1 electrically connects in series with capacitor C1 through switch S1 between the VCO control signal $V_{CNTRL}$ and ground. Resistor R1 further electrically connects in series with the output of the unity gain buffer BUF through switch S2. The input of the unity gain buffer BUF connects in series with capacitor C1 to ground. Capacitor C2 electrically connects in parallel to the R1, C1 circuit branch between the VCO control signal $V_{CNTRL}$ and ground.

With reference to FIGS. 3 and 4, an embodiment of the operation of the loop filter 204 is described. When the ENABLE signal is high, the ENABLE BAR signal is low, switch S2 is open, and the unity gain buffer BUF is disconnected from the resistor R1. Switch S1 is closed and the loop filter 204 operates as a typical loop filter where R1 electrically connects in series with C1 between $V_{CNTRL}$ and ground.

During the ENABLE high period, the charge pump 102 can charge or discharge the integral capacitor C1 with a constant current according to the UP signal or the DOWN signal, respectively. As indicated in FIG. 3, the ENABLE signal is high during the 1/N portions of the UP/DN signal, where N is the integer selected as the capacitance multiplication factor. In other words, N is the integer selected for the blocking factor 1/N. As illustrated in FIG. 3, no capacitance multiplication occurs when N=1 and capacitance multiplication occurs when N is an integer greater than 1.

When the ENABLE signal is low, the ENABLE BAR signal is high, and switch S1 is open. The integral capacitor C1 is electrically disconnected from the resistor R1. Switch S2 is closed and the current $I_{CP}$ will flow through the resistor R1 to the output of the unity gain buffer BUF, where the current $I_{CP}$ is absorbed by the unity gain buffer BUF. In embodiments where the unity gain buffer BUF has small output impedance, the output voltage of the unity gain buffer BUF is approximately constant, which is approximately the same as the voltage of the integral capacitor C1. For example, if the voltage of the integral capacitor C1 is VC1, then the output of the unity gain buffer BUF is approximately the same as VC1 when there is no current from the charge pump 104. And when the charge pump current is $I_{CP}$, then the output voltage is VC1+$I_{CP}$*Ro, where Ro is the output impedance of the unity gain buffer BUF. When Ro is very small, such that, for example, Ro is less than approximately 1% of the value of R1, then the value of $I_{CP}$*R1 is approximately zero and the output voltage of the unity gain buffer BUF will be close to VC1.

During the ENABLE low period, the charge pump 102 cannot charge or discharge the integral capacitor C1 even when the UP signal or the DOWN signal, respectively, is enabled. As indicated in FIG. 3, the ENABLE signal is low during the (N−1)/N portions of the UP/DN signal, where N is the integer selected as the capacitance multiplication factor.

The loop filter 204 operates in a time division mode, where the charge/discharge time of the integral capacitor C1 having capacitance C is controlled by the blocking circuit 202. If the UP/DN pulse is blocked a factor N, it takes N times the time for the charge pump 102 to charge/discharge the integral capacitor C1 to a certain amount of charge. The capacitor C1 appears to the PLL circuit 100 to be N times larger. The PLL circuit 100 operates with respect to the damping factor, for example, as comprising the integral capacitor C1 having a capacitance of N×C. In other words, the capacitance of the integral capacitor C1 is multiplied by N with respect to the function of the PLL circuit 100.

In the embodiment of the blocking circuit 202 illustrated in FIG. 2 and the embodiments of the function of the blocking circuit 202 illustrated in FIG. 3, the ENABLE signal is low when there is no UP/DN signal. Switch S1 is open, switch S2 is closed, and the unity gain buffer BUF connects between the integral capacitor C1 and the resistor R1. In some embodiments, the noise of the unity gain buffer BUF deteriorates or increases the phase noise of the phase lock loop 100. To avoid this, the function of the blocking circuit can be modified.

Figure 5:
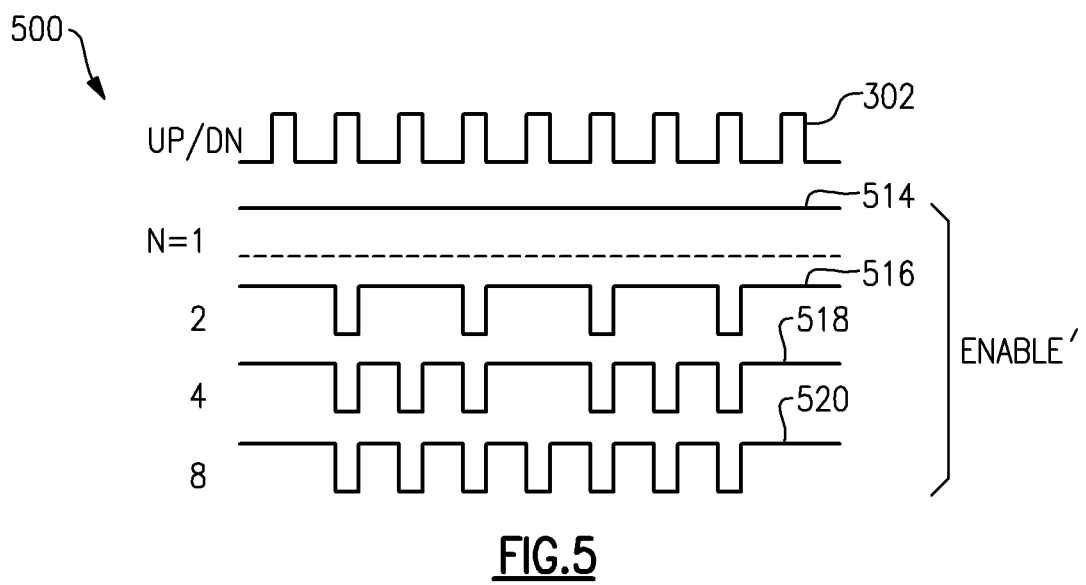
FIG. 5 is a timing diagram illustrating the function of another exemplary blocking circuit, according to certain other embodiments.

FIG. 5 is a timing diagram 500 illustrating the function of another embodiment of an exemplary blocking circuit 202 in terms of an enable signal ENABLE'. Timing diagram 500 comprises the UP/DN signal 302 and ENABLE' signals 514, 516, 518, 520 where N=1, 2, 4, 8, respectively. As indicated in FIG. 5, the ENABLE' signals 514, 516, 518, 520 are high when the UP/DN signal is low. Referring to FIG. 4, switch S1 is closed and switch S2 is open. Thus, R1 is electrically connected to C1, but UP/DN is low indicating that neither the UP signal nor the DOWN signal is enabled, so the integral capacitor C1 will neither charge nor discharge. Because S2 is open when UP/DN is low, the unity gain buffer BUF is disconnected from the circuit and does not provide deterioration of the phase noise of the PLL 100.

When the UP/DN signal is high, the ENABLE' signal 514, 516, 518, 520 is also high for the 1/N portion, respectively, of the UP/DN signal. For example, when N=1, the blocking circuit 202 generates the ENABLE' signal 514. As illustrated, the ENABLE' signal 514 is does not block any occurrences of the UP/DN signal 302. The integrator capacitor C1 charges or discharges at the same rate it would without the blocking circuit 202. No current multiplying occurs.

ENABLE' 516 illustrates another embodiment of the function of the blocking circuit 202 when N=2. ENABLE' 516 permits the charge pump 104 to charge or discharge the integrating capacitor C1 when ENABLE' 516 and UP/DN are high. As illustrated, ENABLE 516' and UP/DN are high at approximately half of the occurrences of the UP/DN signal 302. In other words, an approximate ½ portion of the UP/DN signal is blocked. This has the affect of multiplying the capacitance of the integral capacitor C1 by 2. In some embodiments, this has the affect of multiplying the capacitance of the integrating capacitor C1 by approximately 2. In other embodiments, this has the affect of multiplying the capacitance of the integrating capacitor by precisely 2.

In another example, when N=4, ENABLE' 518 permits the charge pump 104 to charge or discharge the integral capacitor C1 at approximately a quarter of the occurrences of the UP/DN signal 302. An approximate ¾ portion of the UP/DN signal is blocked from the loop filter 204. This has the affect of multiplying the capacitance of the integrating capacitor C1 by 4. In some embodiments, this has the affect of multiplying the capacitance of the integrating capacitor C1 by approximately 4. In other embodiments, this has the affect of multiplying the capacitance of the integrating capacitor by precisely 4.

Similarly, when N=8, ENABLE' 520 permits the charge pump 104 to charge or discharge the integrating capacitor at approximately an eighth of the occurrences of the UP/DN signal 302. An approximate ⅞ portion of the UP/DN signal 302 is blocked from the loop filter 204. This has the affect of multiplying the capacitance of the integrating capacitor C1 by 8. In some embodiments, this has the affect of multiplying the capacitance of the integrating capacitor C1 by approximately 8. In other embodiments, this has the affect of multiplying the capacitance of the integrating capacitor by precisely 8.

Figure 5A:
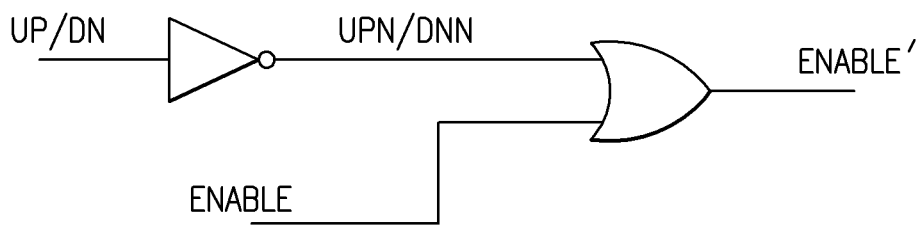
FIG. 5A illustrates a block diagram of another exemplary blocking circuit for use in the digital controlled loop filter of FIG. 2, according to certain embodiments.

In one embodiment, as illustrated in FIG. 5A, the ENABLE' signal 514, 516, 518, 520 is generated by inverting the UP/DN signal 302 to provide a signal UPN/DNN and logically OR'ing the UPN/DNN signal with the ENABLE signal 314,316,318,320, respectively. In other embodiments, other circuits can be used to generate a digitally controlled ENABLE' signal.

Several advantages are achieved by the method and apparatus according to the illustrative embodiments presented herein. To achieve similar operating parameters, a traditional charge pump PLL circuit comprises an integral capacitor having a capacitance of approximately N×C, whereas the one charge pump capacitance multiplying PLL circuit 100 described herein comprises an integral capacitor having a capacitance of approximately C. In embodiments, the physical area of a capacitor mounted on an integrated circuit is directly proportional to its capacitance value. Thus, to achieve similar operating parameters, the one charge pump capacitance-multiplying PLL circuit 100 described herein comprises an integral capacitor having an area of approximately 1/N of the integral capacitor of the traditional charge pump PLL circuit. In an embodiment, this ensures the availability of on chip loop filters for ultra low bandwidth PLLs.

Further, dual path charge pump PLL circuits cannot precisely control the capacitance multiplication ratio. Embodiments of PLL 100 provide a digitally programmed capacitance multiplication ratio, which can be precisely controlled. While dual path charge pump PLL circuits use two charge pumps, embodiments of PLL 100 implement capacitor multiplication through one charge pump and the blocking circuit 202. Other embodiments implement capacitor multiplication through one charge pump and the digital controlled loop filter 106.

Unlike dual path charge pump PLL circuits, embodiments of PLL 100 do not have mismatch between the integral charge pump and the proportional charge pump. Further, embodiments of PLL 100 having one charge pump have reduced current consumption as compared to dual path charge pump PLL circuits. Thus, embodiments of the systems and methods disclosed herein save both integrated circuit area and current consumption, which is important in low cost low bandwidth phase locked loops.

Figure 6:
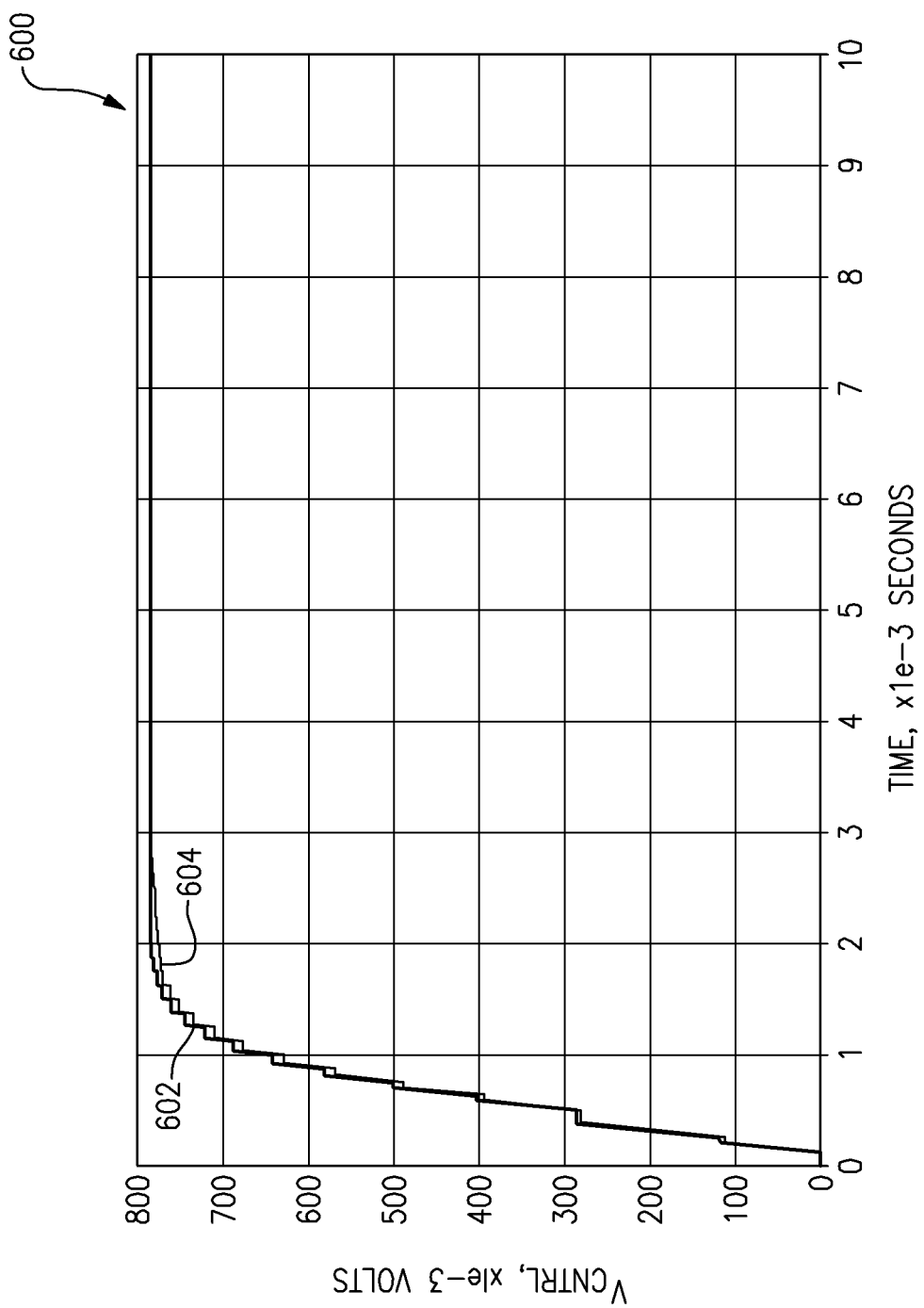
FIG. 6 is a graph illustrating the VCO control voltage from a traditional phase lock loop and the VCO control voltage from an exemplary charge multiplication PLL with one charge pump and a digital controlled loop filter, according to certain embodiments.

Embodiments of the single charge pump PLL 100 with capacitance multiplication comprising an integral capacitor with a capacitance of C and having a capacitance multiplication factor of N operate with similar characteristics as traditional charge pump PLL circuits having an integral capacitor with a capacitance of N×C, but with savings in IC area and cost. FIG. 6 is a graph 600 illustrating the control voltage $V_{CNTRL}$ with respect to time for two simulated type II third order charge pump PLLs each having the following loop parameters:

Kcp=5 µA, where Kcp is the charge pump gain;
Kvco=40 MHz/V, where Kvco is the VCO gain;
Division ratio (M)=2048;
Reference Frequency=8 kHz;
Damping factor ($\zeta$)=0.9375; and
R1=75 k$\Omega$.

Curve 602 represents the control voltage $V_{CNTRL}$ of a traditional PLL circuit where the capacitance of the integral capacitor C1 is 6.4 nF. Curve 604 represents the control voltage $V_{CNTRL}$ of an embodiment of the single charge pump PLL 100 with capacitance multiplication where the capacitance of the integral capacitor is 400 pF and the blocking factor (1/N)=1/16. With respect to the operation of the PLL 100, the integral capacitor C1 appears to have a capacitance of 400 pF×16=6.4 nF. As illustrated in FIG. 6, $V_{CNTRL}$ 602 and $V_{CNTRL}$ 604 are substantially the same. While the operation of the two simulated type II third order charge pump PLLs is nearly identical, the PLL 100 comprises an integral capacitor C1 having a capacitance approximately 1/16 that of the traditional PLL circuit, which advantageously reduces the area needed for the capacitor C1 on an integrated circuit. The reduced area leads to reduced costs of on chip loop filters, especially for ultra low bandwidth PLLs.

It will be appreciated that a computer program comprising program instructions for causing a computer program to control the operation of the blocking circuit or the digital controlled loop filter may be embodied on a record medium, carrier signal, or read-only memory.

The embodiments in the disclosure described with reference to the drawings comprise a computer apparatus and/or processes performed in an integrated circuit. This disclosure also extends to computer programs, particularly computer programs stored on or in a carrier adapted to control operation of the PLL as described herein. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

In the specification the terms "comprise, comprises, comprised and comprising" or any variation thereof and the terms "include, includes, included and including" or any variation thereof are considered to be totally interchangeable and they should all be afforded the widest possible interpretation and vice versa.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A charge pump phase lock loop comprising:
a phase detector configured to generate a phase error signal based at least in part on a comparison of a phase of a reference clock signal and a phase of a feedback signal;
a charge pump configured to convert the phase error signal to a charge current signal;
a digital controlled loop filter configured to receive the charge current signal and the phase error signal and to charge or discharge an integral capacitor with a 1/N portion of the charge current signal to generate a control voltage, N being an integer greater than 1; and
a voltage controlled oscillator configured to receive the control voltage and adjust a clock signal based on the control voltage, the feedback signal based at least in part on the clock signal from the voltage controlled oscillator.

2. The charge pump phase lock loop of claim 1 wherein the digital controlled loop filter blocks a (N−1)/N portion of the charge current signal from charging or discharging the integral capacitor.

3. The charge pump phase lock loop of claim 1 wherein the capacitance of the integral capacitor appears to be approximately N times the actual capacitance of the integral capacitor.

4. The charge pump phase lock loop of claim 1 wherein the charge pump comprises a single charge pump.

5. The charge pump phase lock loop of claim 1 wherein the digital controlled loop filter comprises a blocking circuit configured to block a (N−1)/N portion of the phase error signal.

6. The charge pump phase lock loop of claim 5 wherein the digital controlled loop filter further comprises a loop filter configured to charge or discharge the integral capacitor when the phase error signal is not blocked and to electrically disconnect the integral capacitor from the charge current signal when the phase error signal is blocked.

7. The charge pump phase lock loop of claim 1 wherein the digital controlled loop filter operates in a time division mode and generates a digital control signal based at least in part on N to block the charge current signal from the integral capacitor.

8. A method of capacitance multiplication for a charge pump phase lock loop circuit, the method comprising:
detecting a phase difference between a reference clock and a signal derived from an output clock signal of a voltage controlled oscillator;
converting a phase error signal based at least in part on the phase difference to a charge current signal;
one of charging and discharging an integrating capacitor with a 1/N portion of the charge current signal to generate a control voltage, N being an integer greater than 1; and
applying the control voltage to the voltage controlled oscillator to control the output clock signal.

9. The method of claim 8 wherein the integrating capacitor has a capacitance C and the phase lock loop operates as if the capacitance of the integrating capacitor is approximately N times C.

10. The method of claim 8 further comprising generating an enable signal based at least in part on the phase error signal and N.

11. The method of claim 10 further comprising one of charging or discharging the integrating capacitor with the charge current signal when the enable signal is active.

12. The method of claim 11 further comprising absorbing the charge current signal when the enable signal is inactive.

13. The method of claim 12 wherein the charge current signal is absorbed at an output of a unity gain buffer.

14. The method of claim 8 wherein N comprises a capacitance multiplication factor.

15. A digital controlled loop filter providing capacitance multiplication for a charge pump phase lock loop, the digital controlled loop filter comprising:
a blocking circuit configured to generate a blocking signal based at least in part on a blocking factor comprising an integer greater than 1 and the occurrences of a phase error signal, the phase error signal based at least in part on a phase difference between a reference clock and a signal derived from a clock output of a voltage controlled oscillator; and
a loop filter configured to block a portion of a current based at least in part on the phase error signal from charging or discharging an integrating capacitor, the portion based at least in part on the blocking factor.

16. The digital controlled loop filter of claim 15 wherein the integrating capacitor is configured to integrate the current to provide a control voltage to control the clock output of the voltage controlled oscillator.

17. The digital controlled loop filter of claim 16 wherein the loop filter comprises a resistor electrically coupled in series with the integrating capacitor through a first switch between the control voltage and ground and further electrically coupled in series with an output of a buffer through a second switch.

18. The digital controlled loop filter of claim 17 wherein first switch is configured to close and the second switch is configured to open when the blocking signal is enabled.

19. The digital controlled loop filter of claim 18 wherein first switch is configured to open and the second switch is configured to close when the blocking signal is not enabled.

20. The digital controlled loop filter of claim 15 wherein the loop filter operates in a time division mode and a charge/discharge time of the integrating capacitor is controller by the blocking circuit, the charge pump phase lock loop operating such that the capacitance of the integrating capacitor comprises approximately the blocking factor times the actual capacitance of the integrating capacitor.

* * * * *

UNITED STATES PATENT AND TRADEMARK OFFICE
CERTIFICATE OF CORRECTION

PATENT NO.        : 8,760,201 B1                                Page 1 of 1
APPLICATION NO.   : 13/793438
DATED             : June 24, 2014
INVENTOR(S)       : Ting Gao et al.

It is certified that error appears in the above-identified patent and that said Letters Patent is hereby corrected as shown below:

In the Specification,

In column 7 at line 33, Change "$V_{CNRTL}$." to --$V_{CNTRL}$.--.

In the Claims,

In column 12 at line 55 (approx.), In Claim 20, Change "controller" to --controlled--.

Signed and Sealed this
Twentieth Day of January, 2015

Michelle K. Lee
*Deputy Director of the United States Patent and Trademark Office*